(12) United States Patent
Xie et al.

(10) Patent No.: US 8,940,626 B2
(45) Date of Patent: Jan. 27, 2015

(54) INTEGRATED CIRCUIT AND METHOD FOR FABRICATING THE SAME HAVING A REPLACEMENT GATE STRUCTURE

(75) Inventors: Ruilong Xie, Albany, NY (US); Pranatharthi Haran Balasubramanian, Watervliet, NY (US)

(73) Assignees: GLOBALFOUNDRIES Inc., Grand Cayman (KY); International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/541,979

(22) Filed: Jul. 5, 2012

(65) Prior Publication Data

US 2014/0008720 A1    Jan. 9, 2014

(51) Int. Cl.
*H01L 27/092* (2006.01)
*H01L 21/3205* (2006.01)

(52) U.S. Cl.
USPC ............... 438/587; 257/331; 257/E27.062; 257/E21.294

(58) Field of Classification Search
CPC ................... H01L 27/092; H01L 21/3205
USPC ............ 257/331, E27.062, E21.294; 438/587
See application file for complete search history.

(56) References Cited

U.S. PATENT DOCUMENTS

| | | | |
|---|---|---|---|
| 2009/0057769 A1* | 3/2009 | Wei et al. | 257/369 |
| 2009/0230479 A1* | 9/2009 | Hsu et al. | 257/369 |
| 2010/0112811 A1* | 5/2010 | Yeh et al. | 438/669 |
| 2010/0124818 A1* | 5/2010 | Lee et al. | 438/589 |
| 2011/0003447 A1* | 1/2011 | Kim et al. | 438/270 |
| 2011/0108928 A1* | 5/2011 | Tao et al. | 257/410 |
| 2011/0143529 A1* | 6/2011 | Lee et al. | 438/591 |
| 2012/0306026 A1* | 12/2012 | Guo et al. | 257/407 |

* cited by examiner

*Primary Examiner* — Kevin Parendo
*Assistant Examiner* — Lamont Koo
(74) *Attorney, Agent, or Firm* — Ingrassia Fisher & Lorenz, P.C.

(57) ABSTRACT

A method for fabricating an integrated circuit includes forming a first layer of a workfunction material in a first trench of a plurality of trench structures formed over a silicon substrate, the first trench having a first length and forming a second layer of a workfunction material in a second trench, the second trench having a second length that is longer than the first length. The method further includes depositing a low-resistance fill material onto the integrated circuit to fill any unfilled trenches with the low-resistance fill material and etching the low resistance fill material, the first layer, and the second layer to re-expose a portion of each trench of the plurality of trenches, while leaving a portion of each of the first layer, the second layer, and the low-resistance fill material in place. Still further, the method includes depositing a gate fill material into each re-exposed trench portion.

5 Claims, 14 Drawing Sheets

INTEGRATED CIRCUIT AND METHOD FOR FABRICATING THE SAME HAVING A REPLACEMENT GATE STRUCTURE

TECHNICAL FIELD

Embodiments of the subject matter described herein relate generally to integrated circuits and methods for fabricating integrated circuits. More particularly, the subject matter relates to integrated circuits and methods for fabricating integrated circuits having a replacement gate structure.

BACKGROUND

The integration of hundreds of millions of circuit elements, such as transistors, on a single integrated circuit necessitates further dramatic scaling down or micro-miniaturization of the physical dimensions of circuit elements, including interconnection structures. Micro-miniaturization has engendered a dramatic increase in transistor engineering complexity, such as the inclusion of lightly doped drain structures, multiple implants for source/drain regions, silicidation of gates and source/drains, and multiple sidewall spacers, for example.

The drive for high performance requires high speed operation of microelectronic components requiring high drive currents in addition to low leakage, i.e., low off-state current, to reduce power consumption. Typically, the structural and doping parameters tending to provide a desired increase in drive current adversely impact leakage current.

Metal gate electrodes have evolved for improving the drive current by reducing polysilicon depletion. However, simply replacing polysilicon gate electrodes with metal gate electrodes may engender issues in forming the metal gate electrode prior to high temperature annealing to activate the source/drain implants, as at a temperature in excess of 900° C. Such fabrication techniques may degrade the metal gate electrode or cause interaction with the gate dielectric, thereby adversely impacting transistor performance.

Replacement gate techniques have been developed to address problems attendant upon substituting metal gate electrodes for polysilicon gate electrodes. For example, a polysilicon gate is used during initial processing until high temperature annealing to activate source/drain implants has been implemented. Subsequently, the polysilicon is removed and replaced with a metal gate.

Additional issues arise with lateral scaling, such as the formation of contacts. For example, once the contacted gate pitch gets to about 64 nanometers (nm), there is not enough room to land a contact between the gate lines and still maintain reliable electrical isolation properties between the gate line and the contact. Self-aligned contact (SAC) methodology has been developed to address this problem. Conventional SAC approaches involve recessing the replacement metal gate structure, which includes both work function metal liners (e.g. TiN, TaN, TaC, TiC, TiAlN, etc.) and conducting metal (e.g., W, Al, etc.), followed by a dielectric cap material deposition and chemical mechanical planarization (CMP). However, to set the correct workfunction for the device, sometimes thick work function metal liners are required (e.g., a combination of different metals such as TiN, TiC, TaC, TiC, or TiAlN with a total thickness of more than 7 nm). As gate length continues to scale down, for example for sub-15 nm gates, the replacement gate structure is so narrow that it will be "pinched-off" by the work function metal liners alone, with little or no space remaining for the lower resistance gate metal. This will cause high resistance issue for devices with small gate lengths, and will also cause problems in the SAC replacement gate metal recess, where the metal gate structures for long channel devices are significantly different from short channel devices.

A need therefore exists for a methodology enabling the fabrication of semiconductor devices including integrating both metal replacement gates and self-aligned contacts for both small gate length and larger gate length structures with thick work function metal liner compatibility. Furthermore, other desirable features and characteristics of the present invention will become apparent from the subsequent detailed description of the invention and the appended claims, taken in conjunction with the accompanying drawings, the brief summary, and this background of the invention.

BRIEF SUMMARY

Integrated circuits and methods of fabricating integrated circuits are provided herein. In an embodiment, a method for fabricating an integrated circuit includes forming a first layer of a workfunction material in a first trench of a plurality of trench structures formed over a silicon substrate, the first trench having a first length and forming a second layer of a workfunction material in a second trench of the plurality of trenches, the second trench having a second length that is longer than the first length. The first layer fully fills the first trench, and the second layer partially fills the second trench leaving a portion of the second trench unfilled. The method further includes depositing a low-resistance fill material onto the integrated circuit so as to fill any unfilled trenches with the low-resistance fill material and etching the low resistance fill material, the first layer, and the second layer so as to re-expose a portion of each trench of the plurality of trenches, while leaving a portion of each of the first layer, the second layer, and the low-resistance fill material in place. Still further, the method includes depositing a gate fill material into each re-exposed trench portion.

In another exemplary embodiment, a method for fabricating an integrated circuit includes forming a first layer of a workfunction material in a first trench of a plurality of trench structures formed over a silicon substrate, the first trench having a first length and forming a second layer of a workfunction material in a second trench of the plurality of trenches, the second trench having a second length that is longer than the first length. The first layer fully fills the first trench, and the second layer partially fills the second trench leaving a portion of the second trench unfilled. The method further includes depositing a sacrificial fill material onto the integrated circuit so as to fill any unfilled trenches with the sacrificial fill material and etching the sacrificial fill material, the first layer, and the second layer so as to re-expose a portion of each trench of the plurality of trenches, while leaving a portion of the first layer and the second layer in place, but while completely etching the sacrificial fill material. Still further, the method includes depositing a gate fill material into each re-exposed trench portion.

In yet another exemplary embodiment, an integrated circuit includes a first FET structure and a second FET structure, both of which being formed over a silicon substrate. The first FET structure includes a high-k material layer, a layer of a first workfunction material formed over the high-k material layer, a layer of a barrier material formed over the first workfunction material layer; and a layer of a gate fill material formed over the barrier material layer. The entirety of the barrier material layer and the gate fill material layer are formed above the first workfunction material layer. The second FET structure includes a layer of the high-k material, a layer of a second workfunction material formed over the high-k material layer, a low-resistance material layer formed over the second workfunction material layer, a layer of the barrier material formed over the low-resistance material layer, and a layer of the gate fill material formed over the barrier material layer. The entirety of the barrier material layer and the gate fill material layer are formed above the second workfunction material layer.

BRIEF DESCRIPTION OF THE DRAWINGS

The disclosed embodiments will hereinafter be described in conjunction with the following drawing figures, wherein like numerals denote like elements, and wherein.

DETAILED DESCRIPTION

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

For the sake of brevity, conventional techniques related to semiconductor device fabrication may not be described in detail herein. Moreover, the various tasks and process steps described herein may be incorporated into a more comprehensive procedure or process having additional steps or functionality not described in detail herein. In particular, various steps in the manufacture of semiconductor-based integrated circuits are well known and so, in the interest of brevity, many conventional steps will only be mentioned briefly herein or will be omitted entirely without providing the well-known process details.

The techniques and technologies described herein may be utilized to fabricate MOS integrated circuit devices, including NMOS integrated circuit devices, PMOS integrated circuit devices, and CMOS integrated circuit devices. In particular, the process steps described here can be utilized in conjunction with any semiconductor device fabrication process that forms gate structures for integrated circuits, including both planar and non-planar integrated circuits. Although the term "MOS device" properly refers to a device having a metal gate electrode and an oxide gate insulator, that term will be used throughout to refer to any semiconductor device that includes a conductive gate electrode (whether metal or other conductive material) that is positioned over a gate insulator (whether oxide or other insulator) which, in turn, is positioned over a semiconductor substrate.

Figure 1:
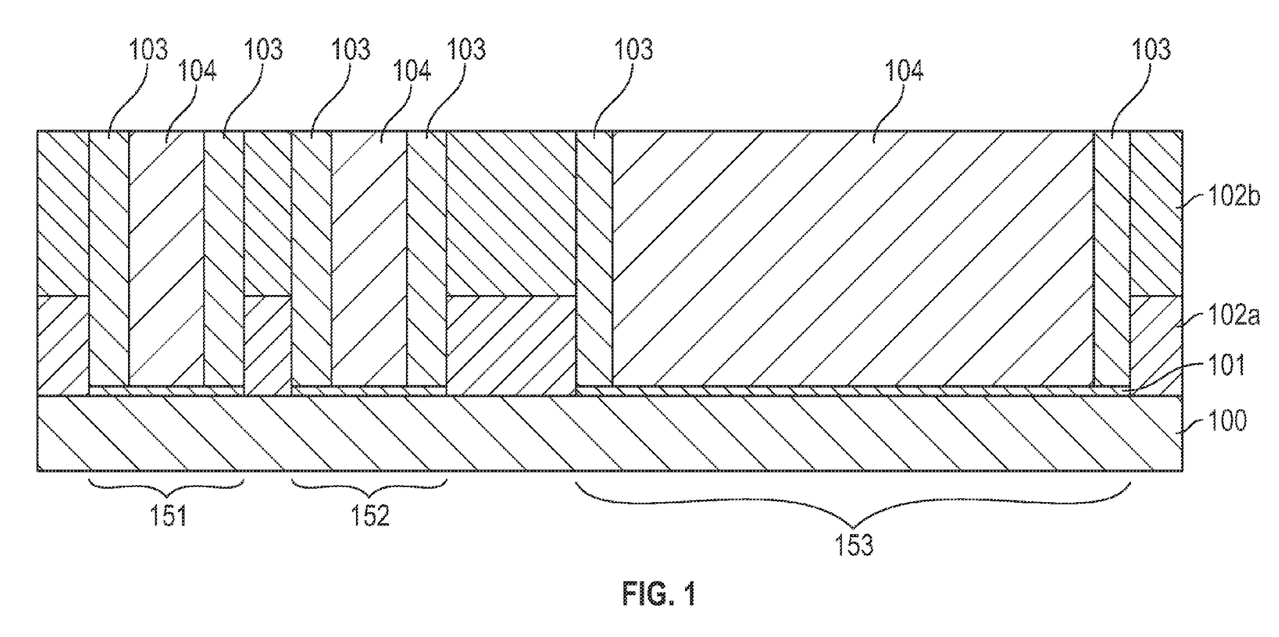
FIGS. 1-9 are partial cross-section views of an integrated circuit illustrating methods for fabricating an integrated circuit having a replacement gate structure in accordance with one embodiment of the present disclosure.
Figure 2:
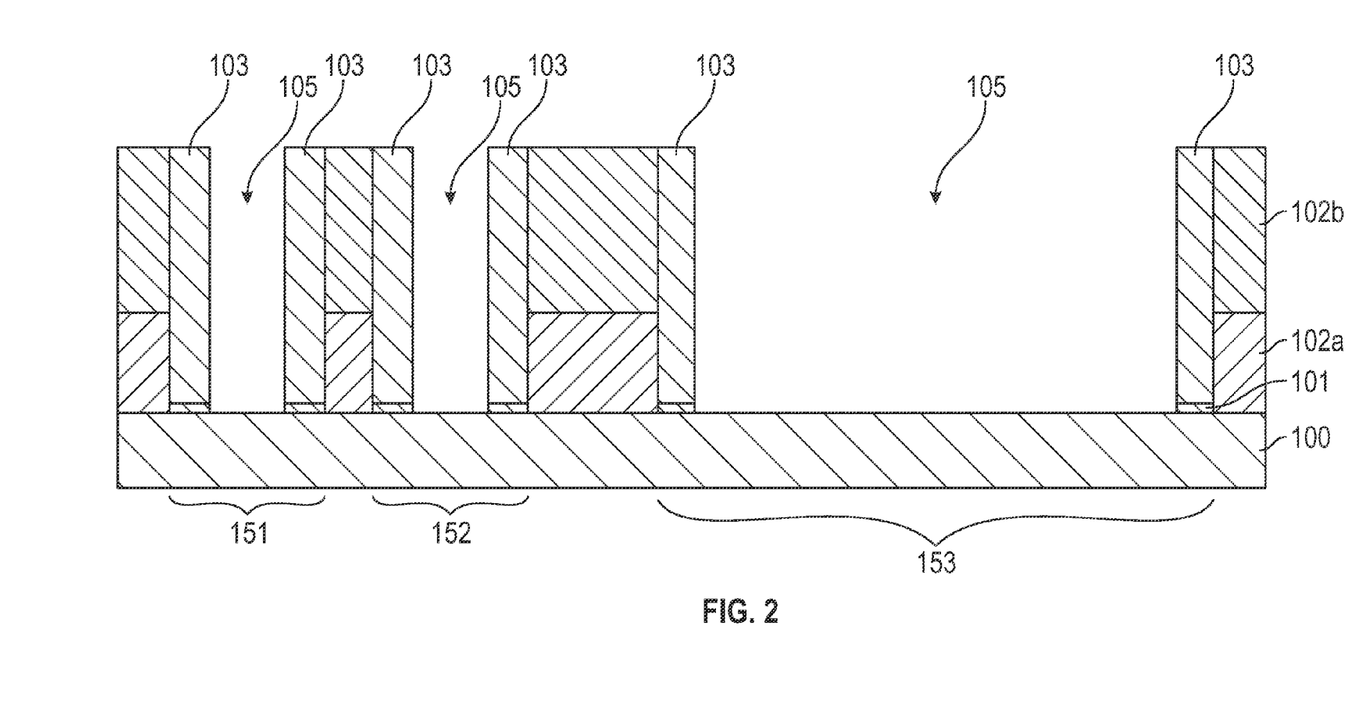

With reference to FIGS. 1 and 2, in one embodiment, depicted is a cross-sectional view of a partially-formed integrated circuit (IC) prior to forming the replacement gate structure therein. In particular, the IC has been designed to have formed therein three separate FETs 151, 152, and 153. In the figures that follow, FET 151 is illustrated as a first type of device, for example a p-type FET (pFET) or an n-type FET (nFET), and FET 152 is illustrated as a second type of device, different from FET 151, for example a pFET or an nFET. Further, FET 153 is illustrated as the second type of device, but having a larger gate length. However, it will be appreciated that a given integrated circuit design may include any number of pFETs and/or nFETs having one or more different gate lengths. As such, FIGS. 1 and 2, and the figures that follow, are intended to be illustrative of the techniques that can be implemented on any type of IC including any number of FETs of different sizes and types.

The semiconductor substrate shown in FIG. 1 includes a silicon material substrate 100. Above the silicon substrate 100 are three "dummy gate" structures 104, which can be made of a polysilicon or similar material. In FIG. 2, the "dummy" polysilicon gate structures 104 have been removed, leaving three trench-like voids 105 (hereinafter "trenches"), one each for the three FETs 151, 152, and 153 to be formed. The trenches 105 are formed by etching away a layer of oxide material 101, for example silicon dioxide. Sidewall spacers 103 are present on either side of the trenches 105, formed from a deposited layer of SiN, for example. One or more interlayer dielectric (ILD) layers, such as layers 102a and 102b, as illustrated, may be present between the gate structures. ILD layers 102a and 102b are typically both oxides, the former having better gap filling qualities while the latter having better dielectric qualities. As such, FIGS. 1 and 2 depict the IC at a stage in the replacement gate forming process, prior to the deposition of any high-k, barrier, or replacement gate fill material, that is conventional and well-known in the so-called "gate last" technological arts related to ICs. As such, greater details regarding the patterning and formation of the trenches 105 in the oxide layer 101, and the formation of the sidewall spacers 103, need not be provided.

Figure 3:
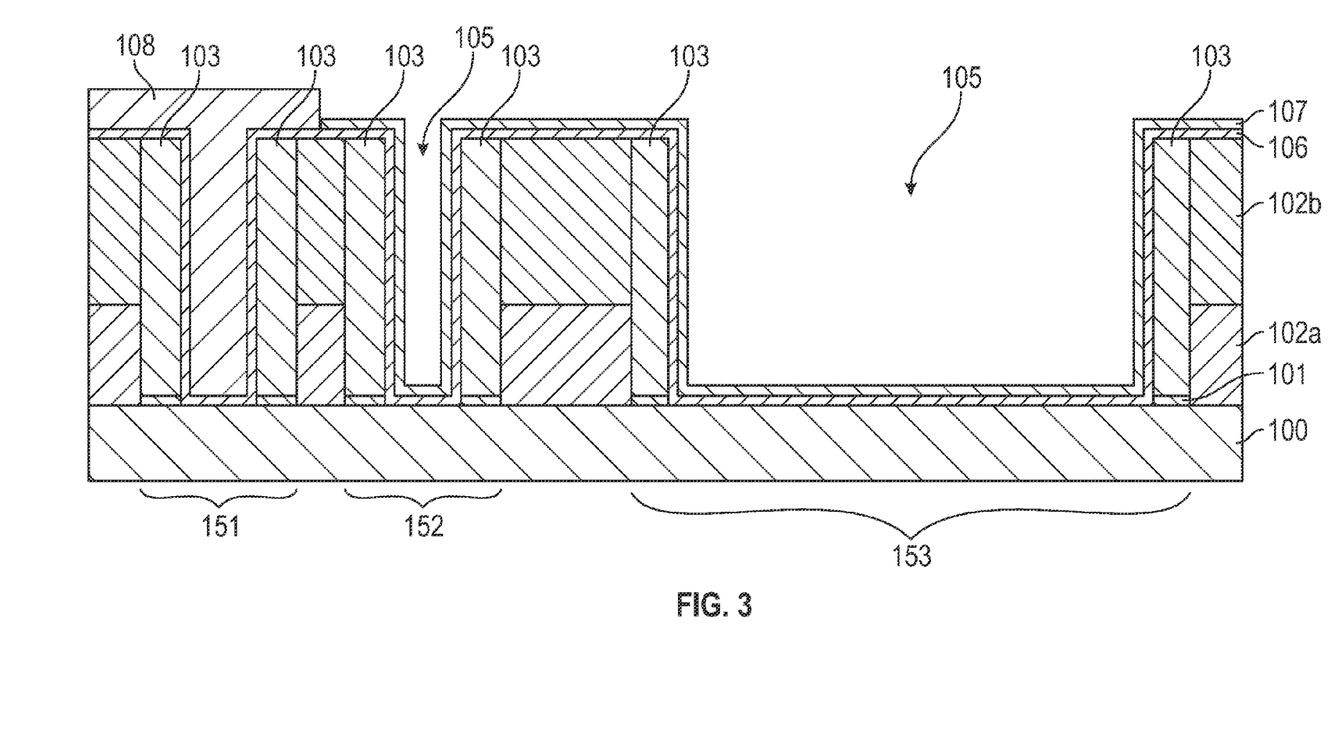

With reference now to FIG. 3, the exemplary process continues with the deposition of a high-k material layer 106. The high-k material layer 106 can include a Hafnium (Hf) or Zirconium (Zr) oxide, or any other metal oxide with a sufficiently high dielectric constant as are well-known in the art. In an exemplary embodiment, the high-k material for layer 106 is $HfO_2$. The high-k material layer 106 can be deposited by any technique known in the art that provides for conformal deposition thereof in the trenches 105. In one embodiment, the high-k material 106 is deposited using atomic layer deposition (ALD).

With continued reference to FIG. 3, one or more workfunction material layers are deposited, patterned, and etched over the high-k layer 106. As noted above, FET 151, as illustrated herein, is of a different type than FETs 152 and 153. As such, two separate workfunction materials are shown being deposited into the FETs 151, and 152/153, respectively. Of course, any workfunction material layer may include two or more workfunction materials. With reference to FETs 152/153, a first type of workfunction material (or materials) 107 is deposited and patterned thereover, and the work function material(s) 107 does not fully fill the gate structure 152/153. With reference to FET 151, a second type of workfunction material (or materials) 108 is deposited and patterned. In this embodiment, because the thickness of the workfunction material(s) 108 is too thick or because of the gate length (width of trench 151) is too small, the trench is fully filled by work function material(s) 108.

In one example, FET 151 can be of the n-type, i.e., an nFET. As such, a portion of the second workfunction material(s) layer 108, an n-type workfunction material(s) is deposited (where through patterning and etching processes, the n-type workfunction material(s) is removed from the pFET, i.e., FETs 152/153 in this example). Any material that is on the n-side of the band-gap, and can be deposited using a process that provides for filling of the trench, for example CVD, may be used. In one embodiment, the n-type workfunction material is TaC. TaC has a workfunction of 4.1 eV, and is suitable for use in a CVD process. Of course, many other n-type workfunction materials can be used. These include, but are not limited to, Ti, Y, Mn, and Er.

In this example, FETs 152/153 can be of the p-type, i.e., pFETs. As such, for the first workfunction material(s) layer 107, a p-type workfunction material(s) is deposited. In one embodiment, the p-type workfunction material(s) may be subsequently removed from the nFET 151. Alternatively, the p-type workfunction material need not be removed from the nFET 151, and as such the layer 108 would include both n- and p-type workfunction materials. Any material that is on the p-side of the band-gap, and can be deposited using a process that provides for conformal deposition, for example ALD, may be used for layer 107. In one embodiment, the p-type workfunction material is TiN. TiN has a workfunction of 5.2 eV, and is suitable for use in an ALD processes. Of course, many other p-type workfunction materials can be used. These include, but are not limited to, Pt, Ir, and Ni. The workfunction values $\phi$ of various metals, when in direct contact with Si, are known in the art.

Figure 4:
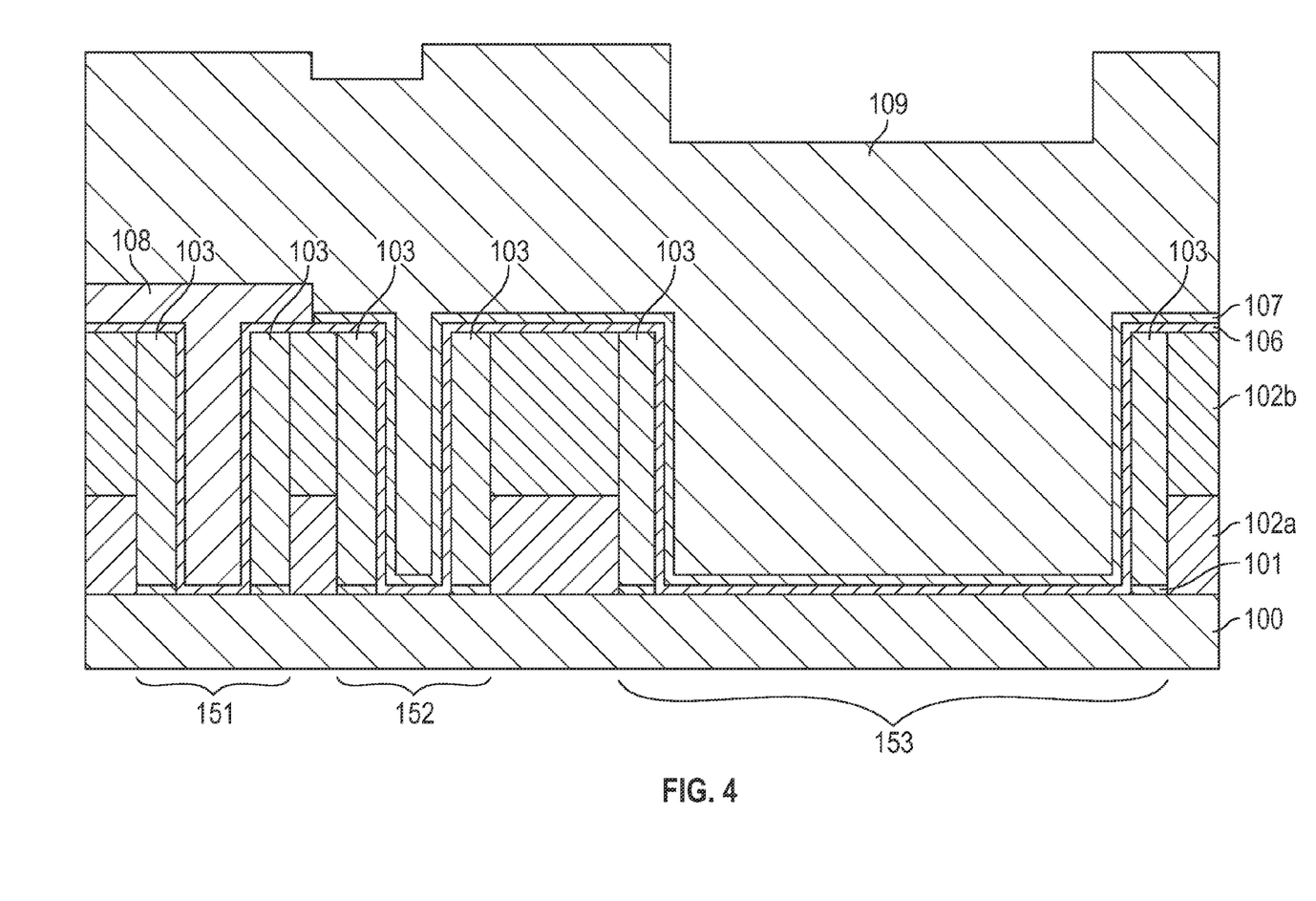

With reference now to FIG. 4, a low-resistance material layer 109 is deposited over the first workfunction material(s) layer 107 and the second workfunction material(s) layer 108. The low-resistance material layer 109 is deposited so as to fill any trenches 105 that remain after the deposition of the first and second workfunction material(s) layers 107, 108. As shown in FIG. 4, the second workfunction material(s) layer 108 has completely filled the trench at FET 151, whereas the first workfunction material 107 just partially filled the trenches 105 at FETs 152 and 153. As such, the low-resistance material layer 109 fills the trenches at FETs 152 and 153. In one embodiment, the low-resistance material layer 109 is a low-resistance tungsten (LRW) material, as is be known in the art. In other embodiments, layer 109 may be a doped a-silicon material. In either embodiment, a thin barrier material may be deposited as part of the layer 109, prior to the tungsten or doped a-silicon material.

Figure 5:
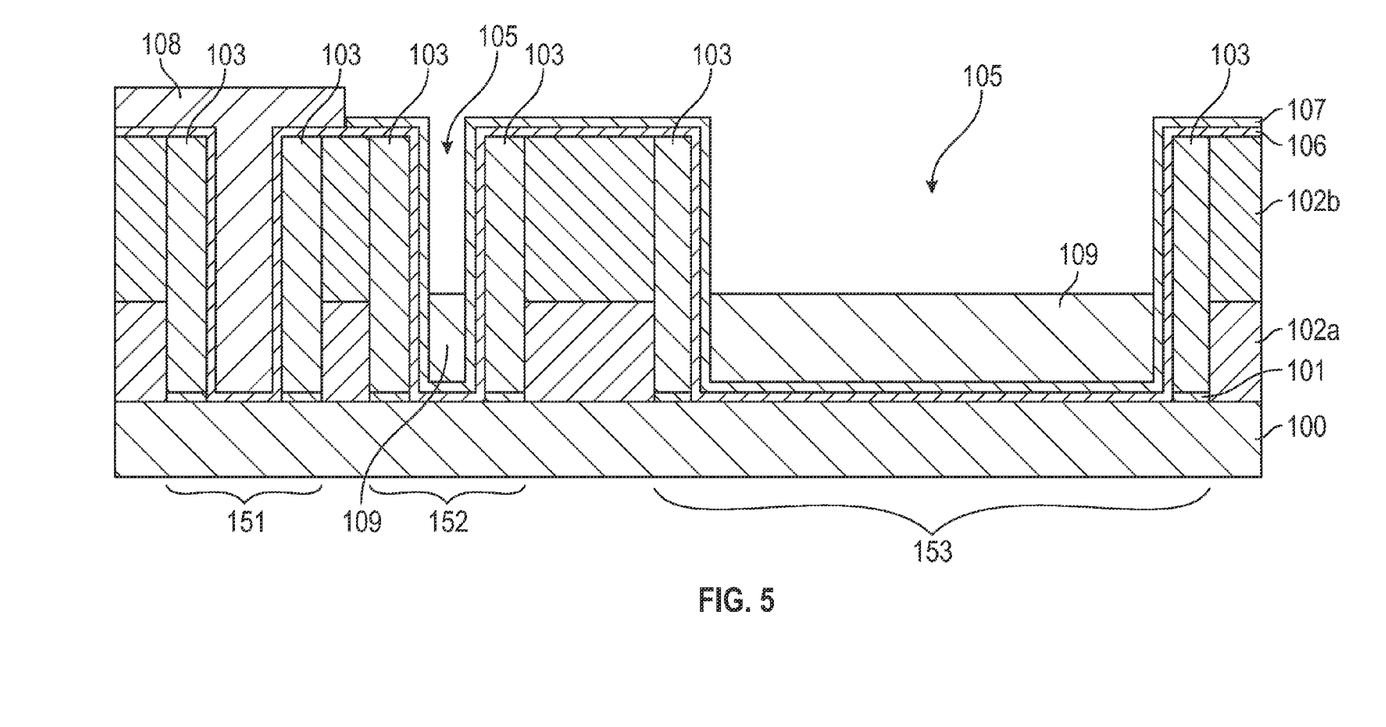
Figure 6:
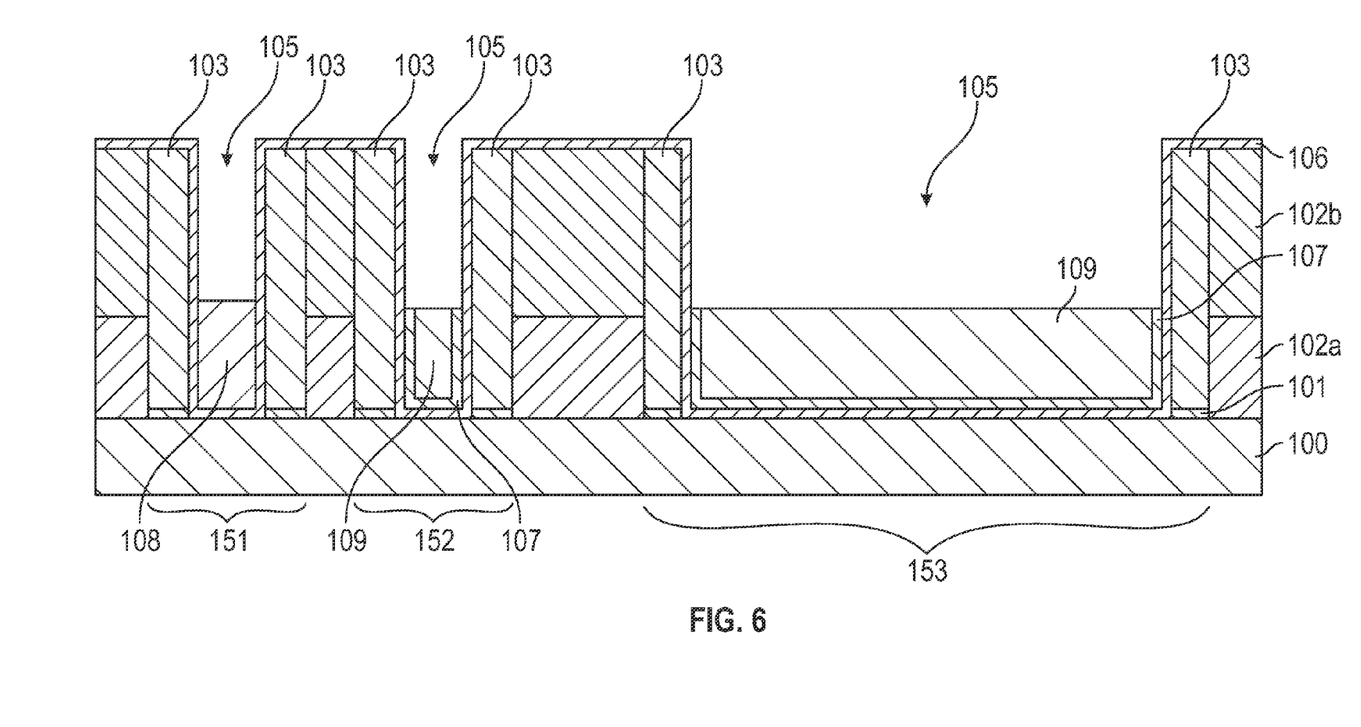

With reference now to FIGS. 5 and 6, after deposition of the low-resistance material layer 109, the structure may be polished using, for example, chemical mechanical planarization techniques (CMP). Thereafter, the layer 109 may be partially etched from the trenches 105 over FETs 152 and 153. Etchants can be used that are either of the liquid-phase ("wet") or plasma-phase ("dry"). In the example shown in FIG. 5, an anisotropic etchant is used to etch the layer 109 from the trenches, without etching the workfunction material(s) layers 107/108. FIG. 6 depicts a subsequent etching step that is selective to the workfunction materials 107 and 108. In this manner, the workfunction material(s) layers can be etched back to a depth within the trenches that, as shown, approximates the height of the remaining low resistance material layer 109.

Figure 7:
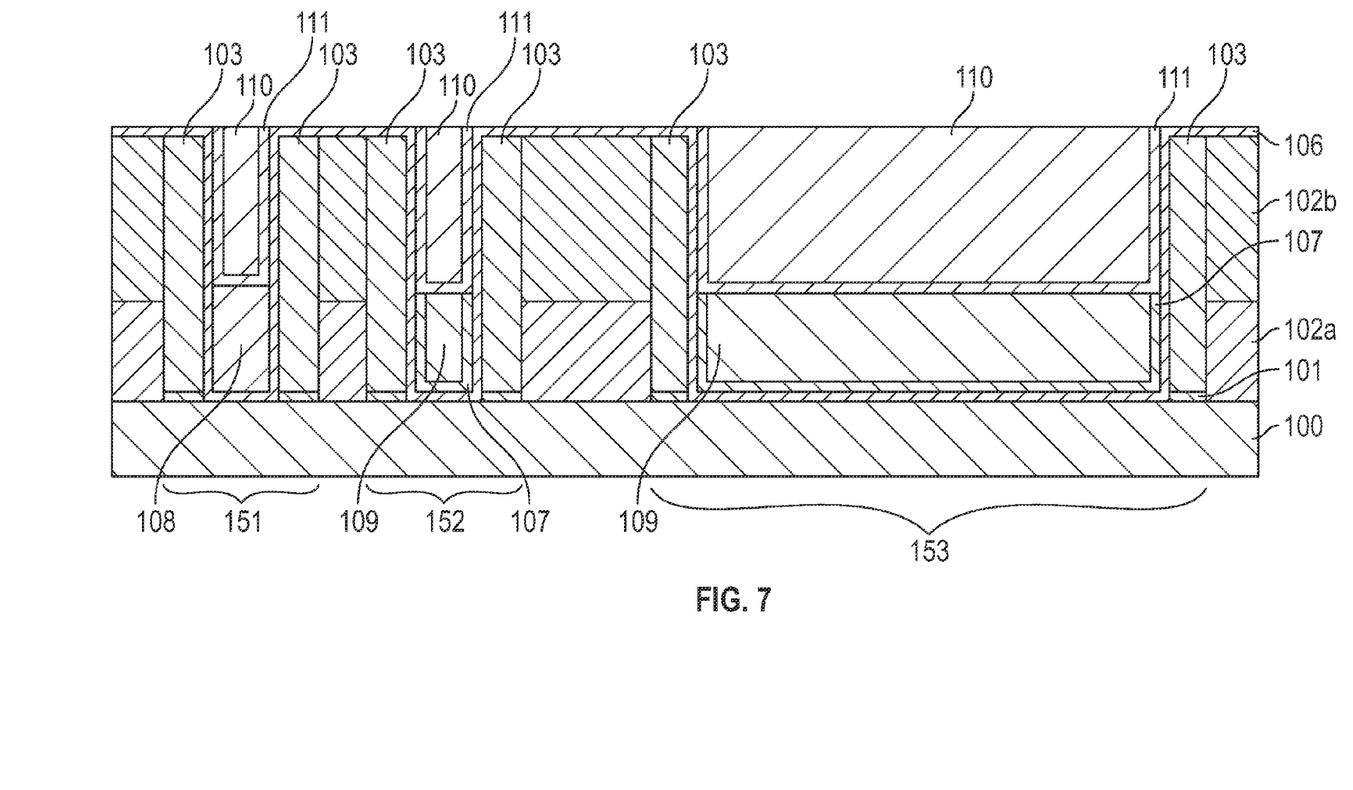

With reference now to FIG. 7, a layer of TiN (or TaN) 111 is deposited conformally over the device and into the trenches 105 re-formed by the etching steps in illustrated in FIGS. 5 and 6. As will be appreciated, TiN (or TaN) is a known barrier material for separating layers in an integrated circuit. Thereafter, over the barrier layer 111, a gate fill material layer 110 is blanket deposited so as to re-fill the trenches 105. The gate fill material layer can be, for example, tungsten or aluminum, with preference given to materials known to have a low electrical resistance. After deposition of the fill material layer 110, the structure may be polished using, for example, chemical mechanical planarization techniques (CMP).

Figure 8:
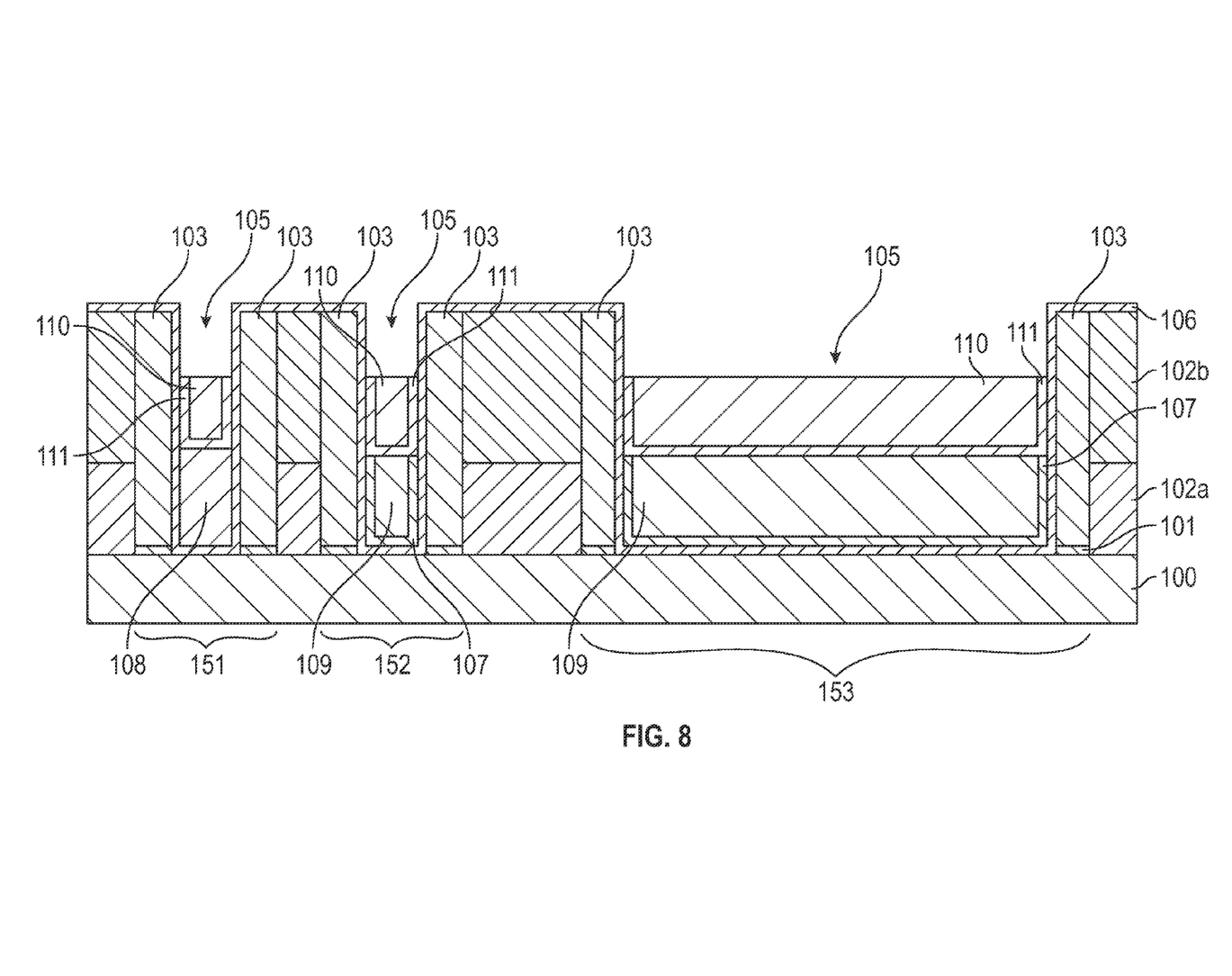
Figure 9:
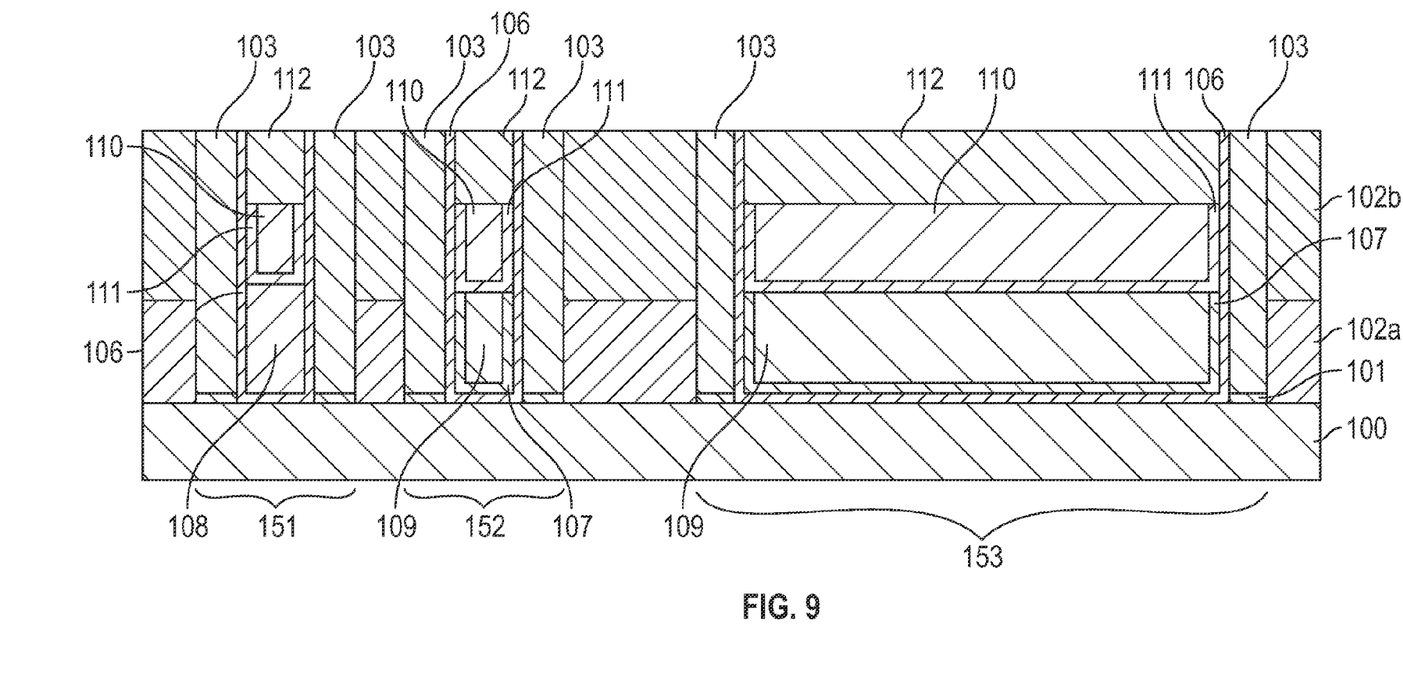

With reference now to FIGS. 8 and 9, the device is etched so as to remove an upper portion of the barrier layer 111 and the fill material layer 110. Here again, various wet or dry etchants will be suitable, as is known in the art. In this manner, a portion of the trenches 105 are re-formed above the fill material for each FET 151, 152, and 153. Thereafter, as shown in FIG. 9, a further process step of depositing a dielectric capping layer 112. In one embodiment, SiN or SiCN may be employed as the dielectric capping layer 112. The dielectric capping layer 112 fills the remaining portion of the trenches 105, thereby covering the layers exposed therewithin. SiN, in one embodiment, can be deposited using plasma enhanced chemical vapor deposition (PECVD), although other techniques known in the art can be employed for filling and capping the trenches 105 with SiN. Thereafter, chemical-mechanical planarization, as is known in the art, can be employed to reduce the height of the structures to a desired thickness.

Figure 10:
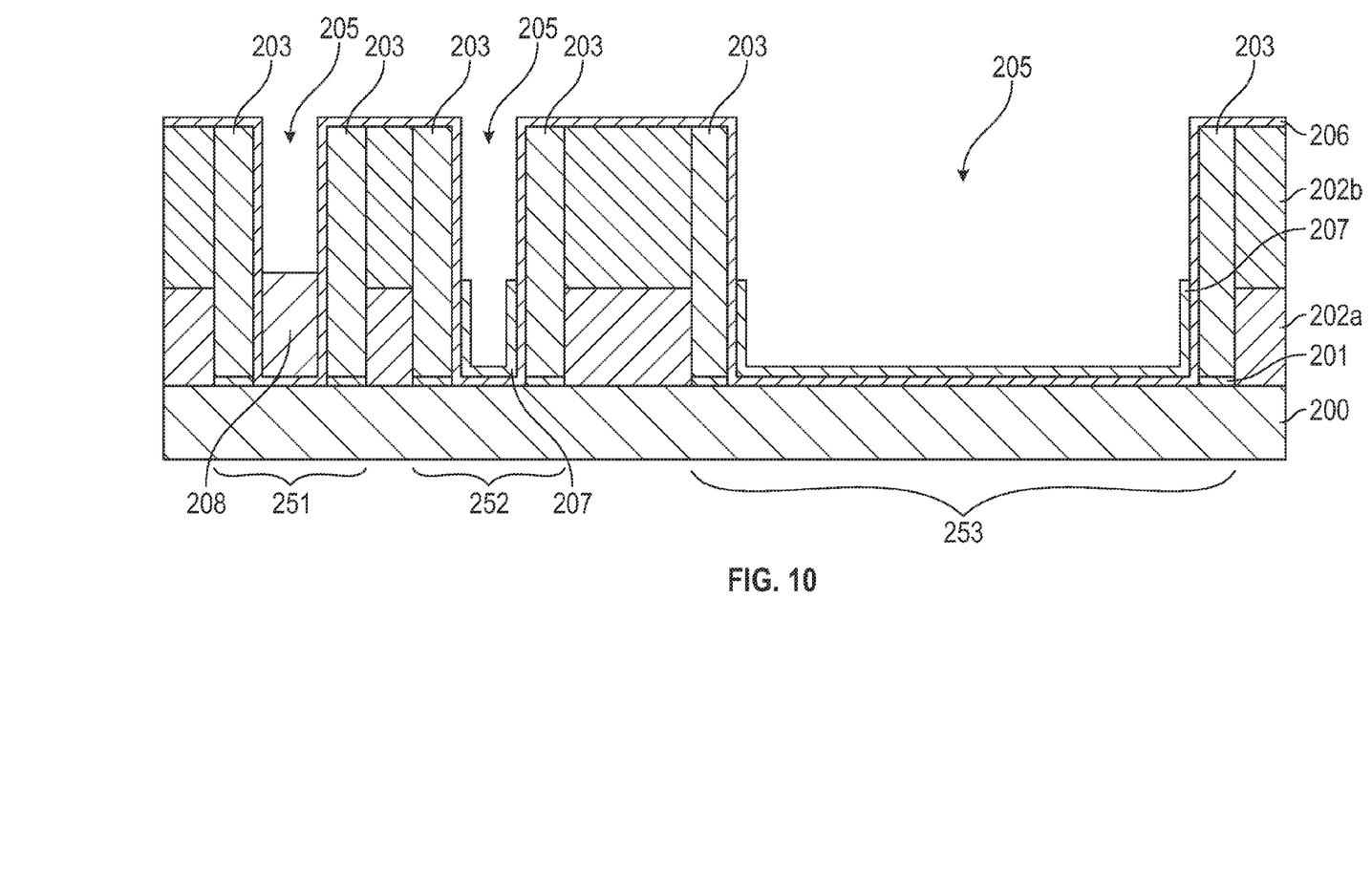
FIGS. 10-14 are partial cross-section views of an integrated circuit illustrating methods for fabricating an integrated circuit having a replacement gate structure in accordance with another embodiment of the present disclosure.

Another embodiment of the present disclosure is described with reference to FIGS. 10-14. In this embodiment, the processing steps associated with FIGS. 1-6 are performed as described above. As such, for the sake of brevity, FIG. 10 begins the description of this embodiment illustrating a processing step immediately subsequent to a step as described above with regard to FIG. 6. Furthermore, it will be noted that all reference numerals have been incremented by 100. Also, in this process flow, the material 209 is not necessarily a low-resistance material, but any sacrificial material that can fill the remaining trenches, and can be used to remove the top portion of the workfunction layers 207 and 208 without damaging any of the bottom portion of layers 207 and 208. The material 209 can be a-Si, OPL/ODL, an oxide, or a combination of layers such as a SiN liner followed by an oxide. As shown in FIG. 10, after recessing the top portion of the workfunction layers 207 and 208, the sacrificial material 209 is removed. Etching, again, can be performed in either the wet or dry manner, suitable etchants therefore being known to those of skill in the art.

Figure 11:
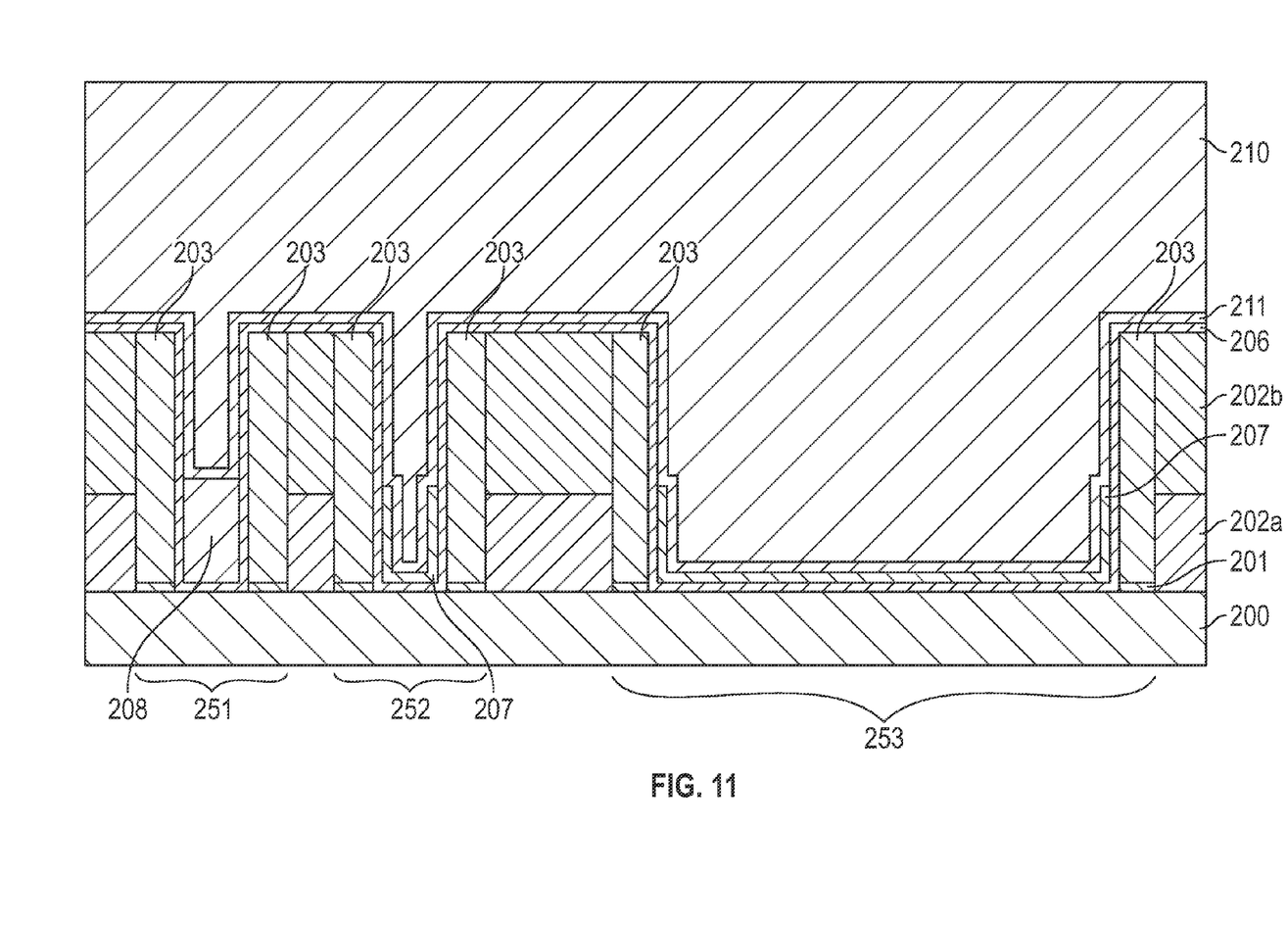
Figure 12:
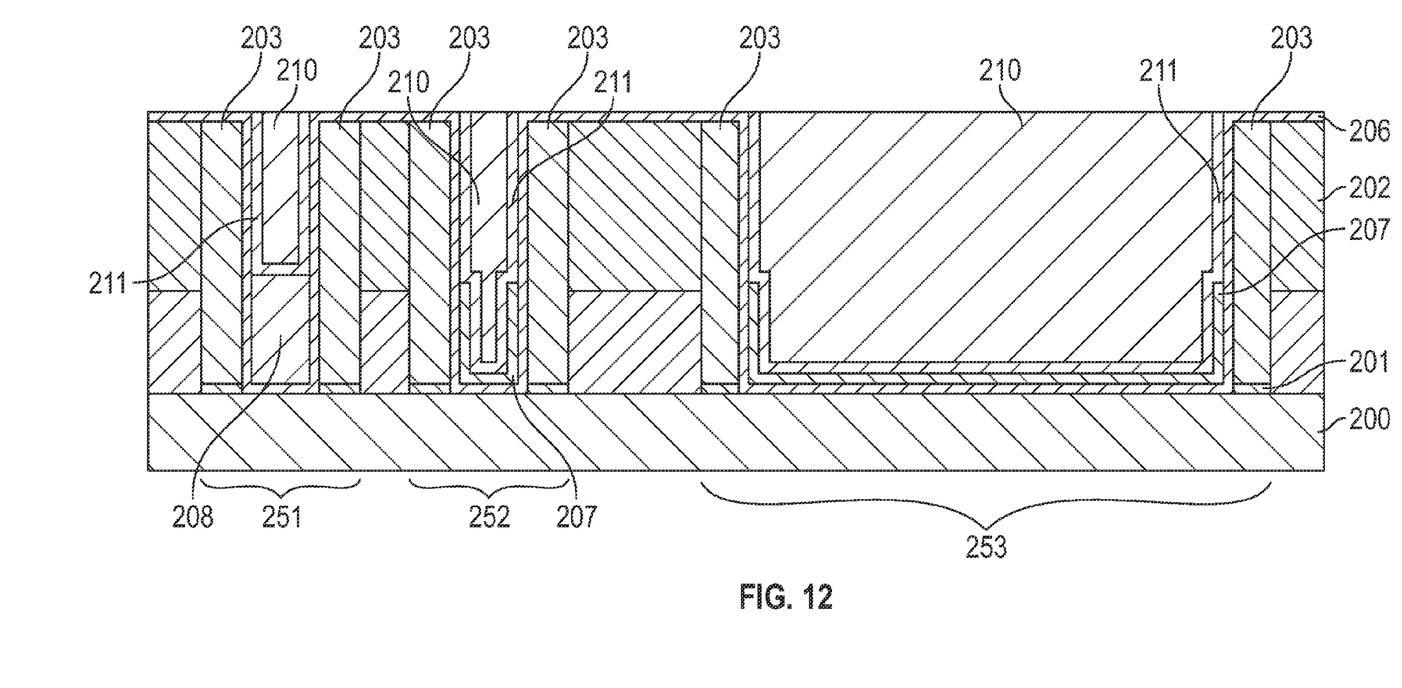

Thereafter, with reference now to FIG. 11, a layer of TiN (or TaN) 211 is deposited conformally over the device and into the trenches 205 re-formed by the etching steps in illustrated in FIGS. 5, 6, and 10. As will be appreciated, TiN (or TaN) is a known barrier material for separating layers in an integrated circuit. Thereafter, over the barrier layer 211, a gate fill material layer 210 is blanket deposited so as to re-fill the trenches 205. The gate fill material layer can be, for example, tungsten or aluminum, with preference given to materials known to have a low electrical resistance. After deposition of the fill material layer 210, the structure may be polished using, for example, chemical mechanical planarization techniques (CMP), as shown in FIG. 12.

Figure 13:
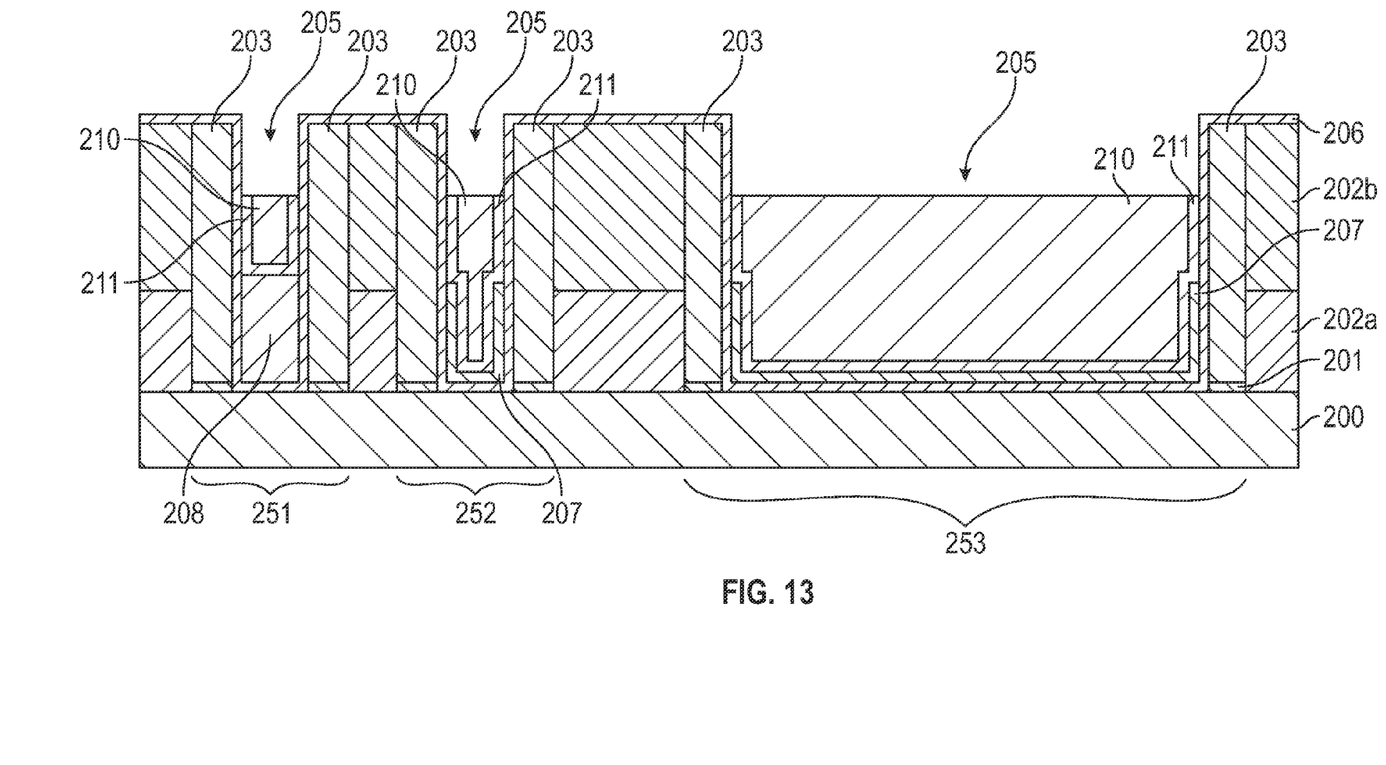
Figure 14:
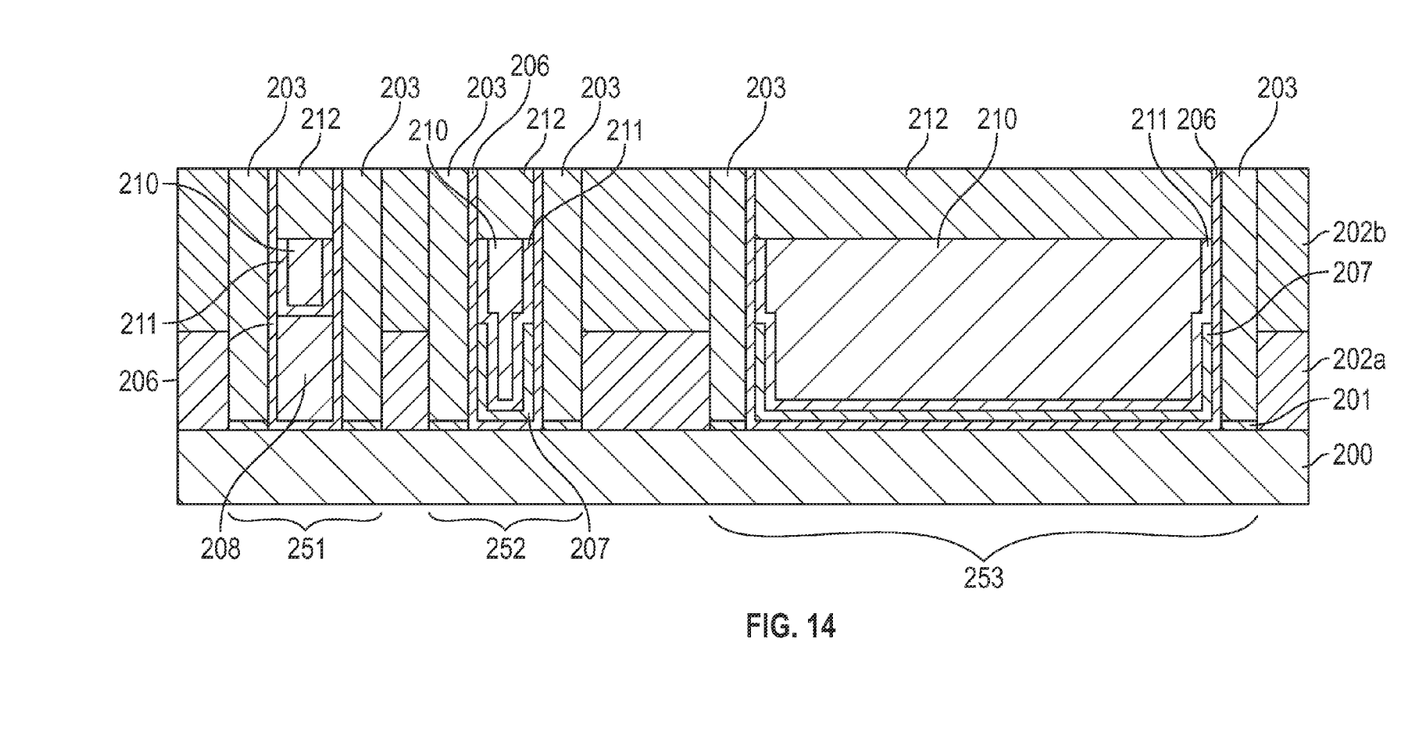

With reference now to FIGS. 13 and 14, the device is etched so as to remove an upper portion of the barrier layer 211 and the fill material layer 210. Here again, various wet or dry etchants will be suitable, as is known in the art. In this manner, a portion of the trenches 205 are re-formed above the fill material for each FET 251, 252, and 253. Thereafter, as shown in FIG. 14, a further process step of depositing a capping layer 212 of, for example, SiN is employed. The capping layer 212 fills the remaining portion of the trenches 205, thereby covering the layers exposed therewithin. SiN, in one embodiment, can be deposited using plasma enhanced chemical vapor deposition (PECVD), although other techniques known in the art can be employed for filling and capping the trenches 205 with SiN. Thereafter, chemical-mechanical planarization, as is known in the art, can be employed to reduce the height of the structures to a desired thickness.

With regard to any embodiment presented herein, further processing steps can be performed to fabricate the integrated circuit, as are well-known in the art. For example, further processing steps can include the formation of contacts and the formation of one or more patterned conductive layer across the device with dielectric layers thereinbetween, among many others. The subject matter disclosed herein is not intended to exclude any subsequent processing steps to form and test the completed IC as are known in the art. Furthermore, with respect to any of the process steps described above, one or more heat treating and/or annealing procedures can be employed after the deposition of a layer, as is commonly known in the art.

As such, the subject matter disclosed herein, in one embodiment, includes an integrated circuit fabrication technique for forming a replacement gate structure that has numerous advantages over techniques conventionally employed in the art. For example, the illustrated process flow offers a robust process flow to make a self-aligned contact suitable for use with a replacement metal gate process flow, and that is compatible with various gate structures. The presently described process flows offer methods for making replacement gate structures with low resistance when the scale of the gate length is so small such that workfunction liners completely fill the gate structures. The process flows also effectively protect the bottom portion of the workfunction liners of devices that are not fully filled by workfunction metals from being damaged by subsequent workfunction liner recess processes, without introducing any additional patterning steps.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described and methods of preparation in an exemplary embodiment without departing from the scope of the invention as set forth in the appended claims and their legal equivalents.

What is claimed is:

1. A method for fabricating an integrated circuit, comprising:
   providing a semiconductor substrate having first and second dummy gate structures formed thereon, each of the first and second dummy gate structures comprising at least a dummy gate electrode formed of a dummy gate material and sidewall spacers formed on vertical sidewalls of the dummy gate electrodes;
   removing, by etching, an entirety of the dummy gate electrodes of both the first and second dummy gate structures so as to expose a silicon material at the semiconductor substrate and so as to expose vertical walls of the sidewall spacers, thereby forming a first trench in place of the dummy gate electrode of the first dummy gate structure and a second trench in place of the dummy gate electrode of the second dummy gate structure, each of the first and second trenches being defined by the sidewall spacers and the silicon material at the semiconductor substrate;
   forming, by conformal deposition, a high-k dielectric material within both the first and second trenches including over an entirety of the exposed silicon material and along an entirety of the exposed vertical walls of the sidewall spacers;
   forming a first layer comprising a first workfunction material in the first trench so as to fill an entirety of the first trench, wherein the first workfunction material is of a first conductivity-determining type;
   forming a second layer comprising a second workfunction material in the second trench, wherein the second layer only partially fills the second trench leaving a portion of the second trench unfilled, and wherein the second workfunction material is of a second conductivity-determining type that is different than the first conductivity-determining type;
   depositing a sacrificial fill material onto the integrated circuit so as to fill the second trench with the sacrificial fill material, wherein the first trench remains entirely filled by the first layer and as such no sacrificial fill material enters the first trench;
   etching the sacrificial fill material, the first layer, and the second layer so as to re-expose a portion of both the first and second trenches, wherein the re-exposed portion of the first trench is defined by a remaining portion of the first layer that extends to a first height above the semiconductor substrate and by the high-k material deposited along the sidewalls, and wherein the re-exposed portion of the second trench is defined by a remaining portion of the second layer that extends to the first height above the semiconductor substrate, the first height being lower than a height of the sidewall spacers, and by the high-k material deposited along the sidewalls, while leaving the remaining portion of the first layer and the second in place, but while completely etching the sacrificial fill material, and wherein the re-exposed portion of the first and second trenches comprises a void space located between at least a portion of the sidewall spacers of each respective re-exposed trench portion, and wherein the void space extends from the first height to the height of the sidewall spacers;
   forming, by conformal deposition, a barrier material layer within the first and second re-exposed trench portions, wherein the barrier material layer does not completely fill either the first or the second re-exposed trench portion;
   depositing a gate fill material into each re-exposed trench portion so as to completely fill an entirety of both the first and the second re-exposed trench portions and etching a portion of the gate fill material and depositing a capping layer over the gate fill material.

2. The method of claim 1, wherein depositing the sacrificial fill material comprises depositing an amorphous silicon, an oxide material, or an organic filling material comprising ODL.

3. The method of claim 1, wherein depositing the gate fill material comprises depositing a material comprising tungsten or aluminum.

4. The method of claim 1, wherein the first layer comprises a pFET workfunction material and the second layer comprises an nFET workfunction material, or wherein the second layer comprises a pFET workfunction material and the first layer comprises an nFET workfunction material.

5. A method for fabricating an integrated circuit, comprising:
- providing a semiconductor substrate having first and second dummy gate structures formed thereon, each of the first and second dummy gate structures comprising at least a dummy gate electrode formed of a dummy gate material and sidewall spacers formed on vertical sidewalls of the dummy gate electrodes;
- removing, by etching, an entirety of the dummy gate electrodes of both the first and second dummy gate structures so as to expose a silicon material at the semiconductor substrate and so as to expose vertical walls of the sidewall spacers, thereby forming a first trench in place of the dummy gate electrode of the first dummy gate structure and a second trench in place of the dummy gate electrode of the second dummy gate structure, each of the first and second trenches being defined by the sidewall spacers and the silicon material at the semiconductor substrate;
- forming, by conformal deposition, a high-k dielectric material within both the first and second trenches including over an entirety of the exposed silicon material and along an entirety of the exposed vertical walls of the sidewall spacers;
- forming a first layer comprising a first workfunction material in the first trench, but not in the second trench, so as to fill an entirety of the first trench, but none of the second trench, wherein the first workfunction material is of a first conductivity-determining type;
- forming a second layer comprising a second workfunction material in the second trench, but not in the first trench, wherein the second layer only partially fills the second trench leaving a portion of the second trench unfilled, but does not fill any of the first trench, and wherein the second workfunction material is of a second conductivity-determining type that is different than the first conductivity-determining type;
- depositing a low-resistance fill material onto the integrated circuit so as to fill the second trench with the low-resistance fill material, wherein the first trench remains entirely filled by the first layer and as such no low-resistance fill material enters the first trench;
- etching the low resistance fill material, the first layer, and the second layer in areas between at least a portion of the sidewall spacers so as to re-expose a portion of both the first and second trenches, wherein the re-exposed portion of the first trench is defined by a remaining portion of the first layer that extends to a first height above the semiconductor substrate and by the high-k material deposited along the sidewalls, and wherein the re-exposed portion of the second trench is defined by a remaining portion of the second layer and the low-resistance fill material each of which extending to the first height above the semiconductor substrate, the first height being lower than a height of the sidewall spacers, and by the high-k material deposited along the sidewalls, while leaving the remaining portion of each of the first layer, the second layer, and the low-resistance fill material in place, and wherein the re-exposed portion of the first and second trenches comprises a void space located between at least a portion of the sidewall spacers of each respective re-exposed trench portion, and wherein the void space extends from the first height to the height of the sidewall spacers;
- forming, by conformal deposition, a barrier material layer within the first and second re-exposed trench portions, wherein the barrier material layer does not completely fill either the first or the second re-exposed trench portion; and
- depositing a gate fill material into each re-exposed trench portion so as to completely fill an entirety of both the first and the second re-exposed trench portions.

* * * * *